United States Patent
Schinder et al.

(10) Patent No.: US 12,219,685 B2
(45) Date of Patent: Feb. 4, 2025

(54) LANGMUIR PROBE OPERATING AT FIXED VOLTAGES

(71) Applicant: Lockheed Martin Corporation, Bethesda, MD (US)

(72) Inventors: Aaron Michael Schinder, Englewood, OH (US); Frans Hendrik Ebersohn, Palmdale, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 925 days.

(21) Appl. No.: 17/233,104

(22) Filed: Apr. 16, 2021

(65) Prior Publication Data
US 2022/0338337 A1  Oct. 20, 2022

(51) Int. Cl.
*H05H 1/00* (2006.01)
*H01J 37/32* (2006.01)

(52) U.S. Cl.
CPC ..... *H05H 1/0075* (2013.01); *H01J 37/32954* (2013.01); *H05H 1/0081* (2013.01)

(58) Field of Classification Search
CPC ............... H05H 1/0075; H05H 1/0081; H01J 37/32954; H01J 37/32935; H01J 37/3299; H01L 22/22; H01L 2924/3025; H01L 2224/48227; H01L 2924/19107; H01L 2224/48091; H01L 2224/48465; H01L 2924/00014; H01L 2924/00; Y10T 29/49007; Y10T 29/49002
See application file for complete search history.

(56) References Cited

U.S. PATENT DOCUMENTS

| | | | |
|---|---|---|---|
| 7,555,948 B2 | 7/2009 | Wiese et al. | |
| 7,696,758 B2 | 4/2010 | Chung et al. | |
| 8,889,021 B2 | 11/2014 | Jensen et al. | |
| 2007/0251339 A1* | 11/2007 | Wiese | H01L 22/22 257/E21.526 |
| 2010/0327873 A1* | 12/2010 | Dorf | H01J 37/32935 324/464 |
| 2020/0161107 A1 | 5/2020 | Kwon et al. | |

FOREIGN PATENT DOCUMENTS

| | | |
|---|---|---|
| CN | 103140009 B | 11/2015 |
| CN | 111403056 A | 7/2020 |
| KR | 10-1177377 B1 | 8/2012 |

OTHER PUBLICATIONS

B. Buttenschon et al., "A Helicon Plasma Source as a Prototype for a Proton-Driven Plasma Wakefield Accelerator," *40th EPS Conference on Plasma Physics*, p. 2.208, Downloaded on Nov. 9, 2020.
D.L. Brown et al., "Experimental Assessment of Double Langmuir Probe Analysis Techniques in a Hall Thruster Plume," *Air Force Research Laboratory (AFMC)*, Downloaded Nov. 9, 2020.

* cited by examiner

*Primary Examiner* — Xiuyu Tai
(74) *Attorney, Agent, or Firm* — Baker Botts L.L.P.

(57) ABSTRACT

In one embodiment, systems and methods include using a Langmuir probe to measure a plasma. The Langmuir probe comprises a housing, wherein the housing comprises an outer diameter and an inner diameter, wherein the inner diameter defines an internal cavity. The Langmuir probe further comprises a plurality of bodies, wherein the plurality of bodies is disposed at least partially within the inner cavity, wherein each of the plurality of bodies comprise a set of internal cavities. The Langmuir probe further comprises a plurality of double Langmuir probes disposed each set of the internal cavities.

14 Claims, 4 Drawing Sheets

LANGMUIR PROBE OPERATING AT FIXED VOLTAGES

TECHNICAL FIELD

This disclosure generally relates to obtaining a parameter of a plasma, and more specifically to an improved Langmuir probe.

BACKGROUND

The operation of single and double Langmuir probes requires sweeping the offset voltage to derive plasma parameters. This mode of operation requires an adequate power supply to provide the varying offset voltage. Further, this limits the collection rate to the maximum sweep frequency of the power supply.

SUMMARY

According to an embodiment, a Langmuir probe comprises a housing, wherein the housing comprises an outer diameter and an inner diameter, wherein the inner diameter defines an internal cavity. The Langmuir probe further comprises a plurality of bodies, wherein the plurality of bodies is disposed at least partially within the inner cavity, wherein each of the plurality of bodies comprise a set of internal cavities. The Langmuir probe further comprises a plurality of double Langmuir probes disposed each set of the internal cavities.

According to another embodiment, a non-transitory computer-readable medium comprises instructions that are configured, when executed by a processor, to receive a first data point, a second data point, and a third data point. The instructions cause the processor to further determine a current-voltage relationship based, at least in part, on the first data point, the second data point, and the third data point by extrapolating a curve to fit the first data point, the second data point, and the third data point based on a function. The instructions cause the processor to further determine an ion saturation current based on a correction to the curve to accommodate ion sheath expansion. The instructions cause the processor to further determine an electron temperature of a plasma and determine an electron density of the plasma.

According to a further embodiment, a system for measuring a plasma, comprises a Langmuir probe, a data acquisition system, and an information handling system. The Langmuir probe comprises a housing, wherein the housing comprises an outer diameter and an inner diameter, wherein the inner diameter defines an internal cavity. The Langmuir probe further comprises a plurality of bodies, wherein the plurality of bodies is disposed at least partially within the inner cavity, wherein each of the plurality of bodies comprise a set of internal cavities. The Langmuir probe further comprises a plurality of double Langmuir probes disposed each set of the internal cavities. The data acquisition system is coupled to the Langmuir probe. The information handling system is communicatively coupled to the data acquisition system.

In the disclosed embodiments, a Langmuir probe comprises a plurality of double Langmuir probes (for example, three sets of double Langmuir probes) operating at fixed voltages. These embodiments may provide for high time-resolution Maxwellian plasma density and temperature measurements with the removal of performing voltage sweeps by extrapolating and inferring the current-voltage relationship from measurements applied at these fixed values.

Certain embodiments may include none, some, or all of the technical advantages discussed above. One or more other technical advantages may be readily apparent to one skilled in the art from the figures, descriptions, and claims included herein.

BRIEF DESCRIPTION OF THE DRAWINGS

To assist in understanding the present disclosure, reference is now made to the following description taken in conjunction with the accompanying drawings, in which.

DETAILED DESCRIPTION

To facilitate a better understanding of the present disclosure, the following examples of certain embodiments are given. The following examples are not to be read to limit or define the scope of the disclosure. Embodiments of the present disclosure and its advantages are best understood by referring to FIGS. 1 through 4, where like numbers are used to indicate like and corresponding parts.

Figure 1:
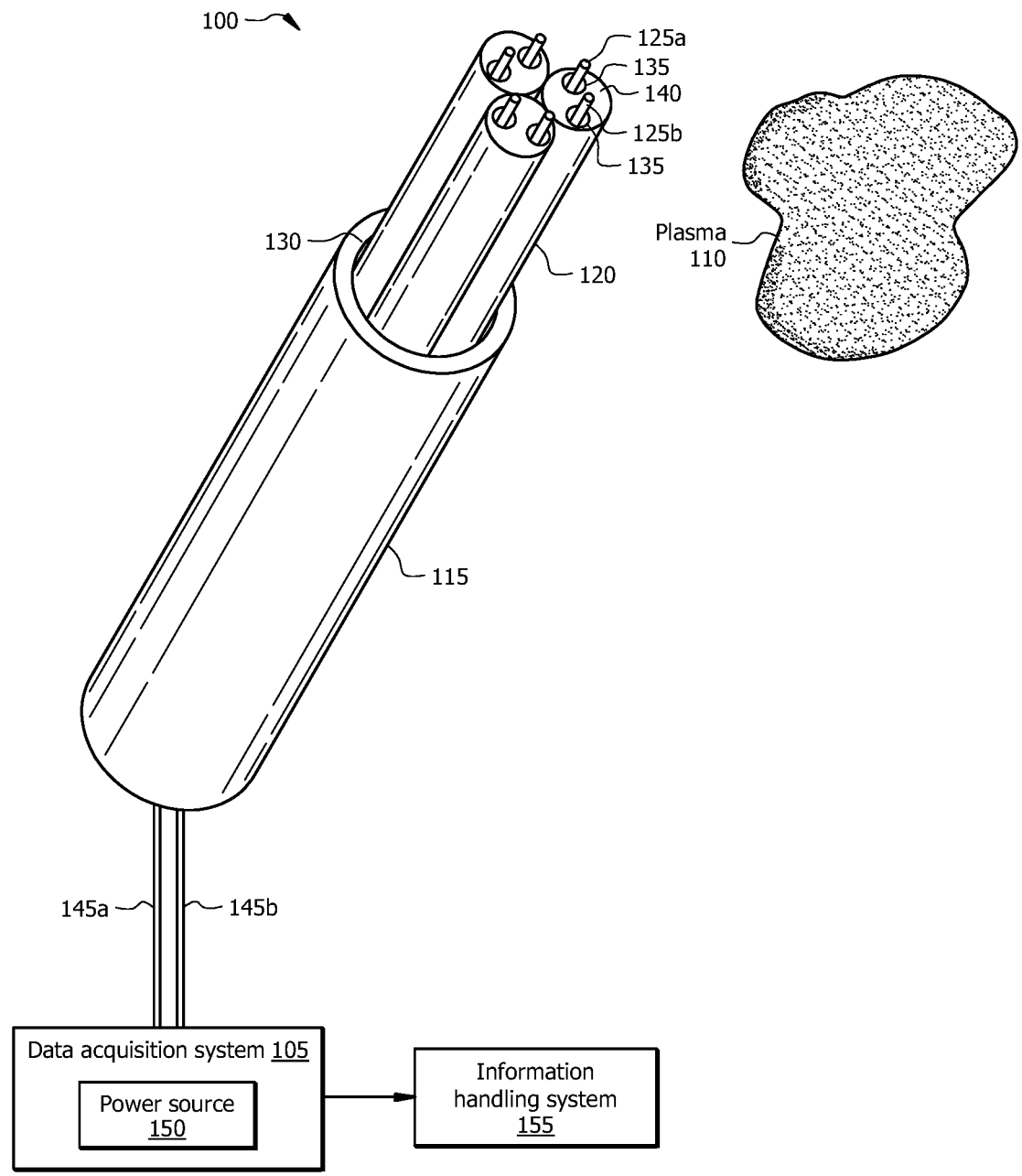
FIG. 1 illustrates an example Langmuir probe, according to certain embodiments.

FIG. 1 illustrates an example Langmuir probe 100 coupled to a data acquisition system 105. The Langmuir probe 100 may be configured to measure a parameter of a plasma 110. Without limitations the parameter of the plasma 110 measured by the Langmuir probe 100 may be density, temperature, or combinations thereof. The Langmuir probe 100 may comprise a housing 115, a plurality of bodies 120, and a plurality of double Langmuir probes 125a and 125b. The housing 115 may be configured to contain the plurality of bodies 120. The housing 115 may be comprised of any suitable materials, including, but not limited to, metals, nonmetals, ceramics, composites, polymers, and any combinations thereof. In one or more embodiments, the housing 115 may comprise of aluminum. The housing 115 may be any suitable size, height, shape, or any combinations thereof. As illustrated, the housing 115 may be in the shape of a cylindrical rod. The housing 115 may be operable to be maneuverable by a user (i.e., handheld). The cross-section of the housing 115 may comprise an inner diameter and an outer diameter, wherein the outer diameter is larger than the inner diameter. The housing 115 may comprise an internal cavity 130 defined by the inner diameter of the housing 115. As illustrated, the plurality of bodies 120 may be disposed at least partially within the internal cavity 130 of the housing 115.

The plurality of bodies 120 may be secured within the internal cavity 130 by any suitable means. Without limitations, such means may include, adhesives, brazing, welding, suitable fasteners, threading, or any combinations thereof. As illustrated, there may be three of the plurality of bodies 120 disposed within the housing 115, however, the present disclosure is not limited to this number of bodies 120. The plurality of bodies 120 may be configured to contain the plurality of double Langmuir probes 125a and 125b. The plurality of bodies 120 may be comprised of any suitable materials, including, but not limited to, metals, nonmetals, ceramics, composites, polymers, and any combinations thereof. In one or more embodiments, each of the plurality of bodies 120 may comprise of aluminum. The plurality of bodies 120 may be any suitable size, height, shape, or any combinations thereof. As illustrated, each of the plurality of bodies 120 may be in the shape of a cylindrical rod. The plurality of bodies 120 may comprise a set of internal cavities 135, wherein the length of each set of internal cavities 135 is the same as the length of each of the plurality of bodies 120. In embodiments, the plurality of bodies 120 may be disposed so as to abut each other within a grouping. As illustrated, the plurality of double Langmuir probes 125a and 125b may be disposed within the set of internal cavities 135 of each of the plurality of bodies 120.

The plurality of double Langmuir probes 125a and 125b may be secured within each of the set of internal cavities 135 by any suitable means. Without limitations, such means may include, adhesives, brazing, welding, suitable fasteners, threading, or any combinations thereof. As illustrated, there may be three sets of the plurality of double Langmuir probes 125a and 125b disposed within respective plurality of bodies 120, however, the present disclosure is not limited to this number of double Langmuir probes 125a and 125b. The plurality of double Langmuir probes 125a and 125b may be comprised of any suitable materials, including, but not limited to, metals, nonmetals, ceramics, composites, polymers, and any combinations thereof. In one or more embodiments, each of the e or more double Langmuir probes 125a and 125b may comprise of tungsten. The plurality of double Langmuir probes 125a and 125b may be any suitable size, height, shape, or any combinations thereof. As illustrated, each of the plurality of double Langmuir probes 125a and 125b may be in the shape of a wire or thin rod. The plurality of double Langmuir probes 125a and 125b may extend past a top end 140 of each of the plurality of bodies 120 in order to make direct contact with or be inserted into the plasma 110. The plurality of double Langmuir probes 125a and 125b may be configured to apply a current to the plasma 110 at a fixed voltage.

As illustrated, the Langmuir probe 100 may be coupled to the data acquisition system 105. Each of the plurality of double Langmuir probes 125a,b may be electrically connected to the data acquisition system 105 through a set of leads 145a and 145b. The data acquisition system 105 may be operable to determine the relationship between the current applied to the plasma 110 and the fixed voltage. The data acquisition system 105 may comprise a power source 150 (for example, one or more batteries) operable to provide power to each of the plurality of double Langmuir probes 125a,b. In one or more embodiments, the power source 150 may provide different fixed voltages to the plurality of double Langmuir probes 125a,b (for example, 1 V, 50 V, and 60 V). The data acquisition system 105 may transmit measurements and data to an information handling system 155, wherein the information handling system 155 may be operable to determine other parameters such as density and/or temperature based on the current-voltage relationship determined by the data acquisition system 105.

Figure 2:
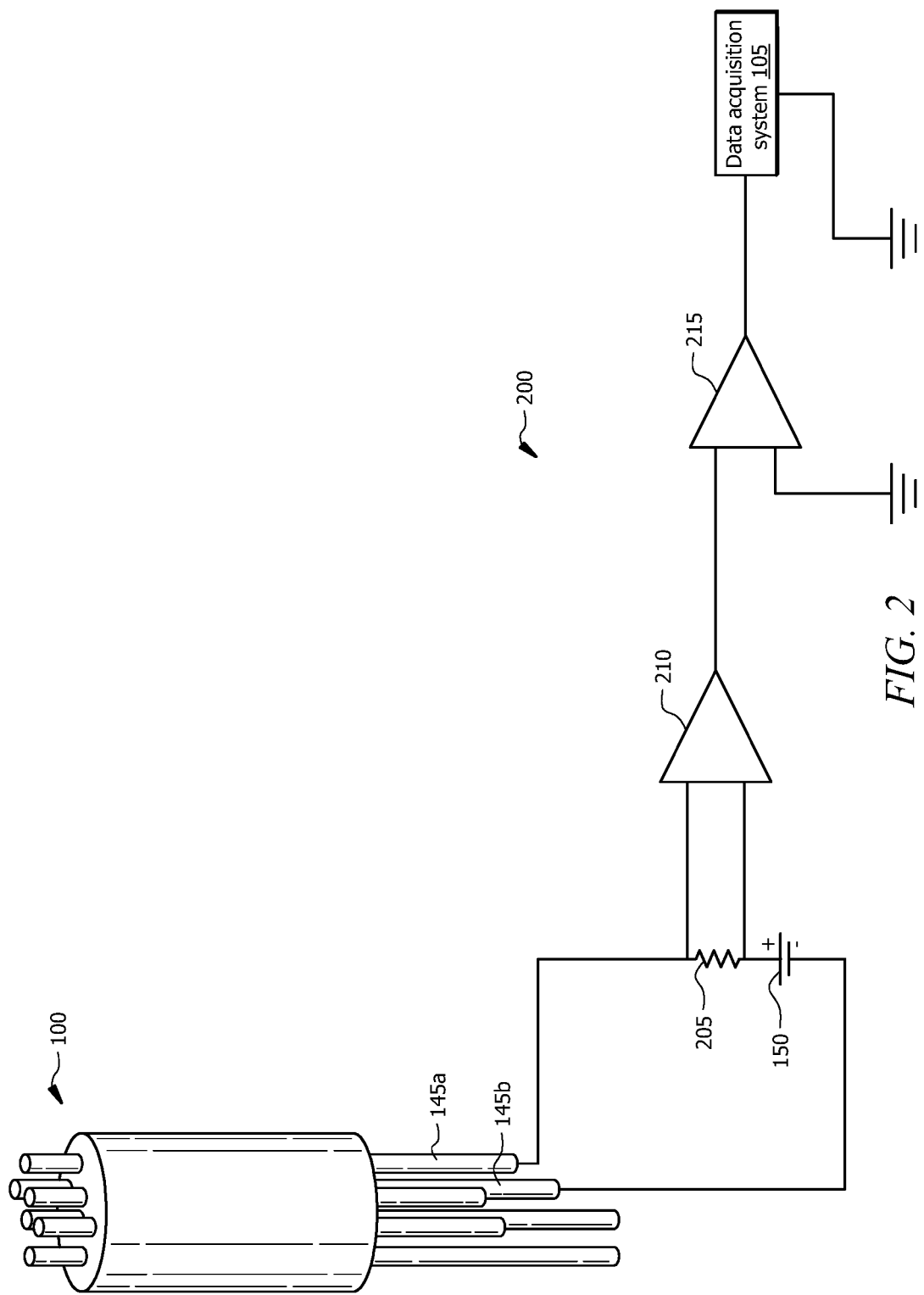
FIG. 2 illustrates an example electrical circuit of the Langmuir probe in FIG. 1, according to certain embodiments.

FIG. 2 illustrates an example electrical circuit 200 used by the Langmuir probe 100 to determine the current-voltage relationship for each of the plurality of double Langmuir probes 125a, 125b. In one or more embodiments, the plurality of double Langmuir probes 125a, 125b may be independent, and the electrical circuit for each is floating. There may be an equivalent number of electrical circuits 200 to the number of sets of leads 145a,b. As illustrated, the electrical circuit 200 may include the set of leads 145a,b for one of the plurality of double Langmuir probes 125a,b, the power source 150, a resistor 205, a first amplifier 210, and a second amplifier 215. In embodiments, each of the components within the electrical circuit 200 may be electrically coupled to one another. The resistor 205 may be disposed in series with the power source 150, wherein the power source 150 may be operable to provide a voltage to drive a current across the resistor 205. The current may flow through the one of the plurality of double Langmuir probes 125a,b while inserted into the plasma 110 (referring to FIG. 1). The current may be related to the values of the resistance of the resistor 205 and the voltage of the power source 150. The current may be input into the first amplifier 210, wherein the first amplifier 210 may be an instrumentation amplifier, and wherein the first amplifier 210 may increase the magnitude of the signal value of the current. The output of the first amplifier 210 may be an input to the second amplifier 215, wherein the second amplifier 215 may be an isolation amplifier. Both the first amplifier 210 and the second amplifier 215 may be any suitable operational amplifiers. The output of the second amplifier 215 may be sent to the data acquisition system 105 for further processing.

Figure 3:
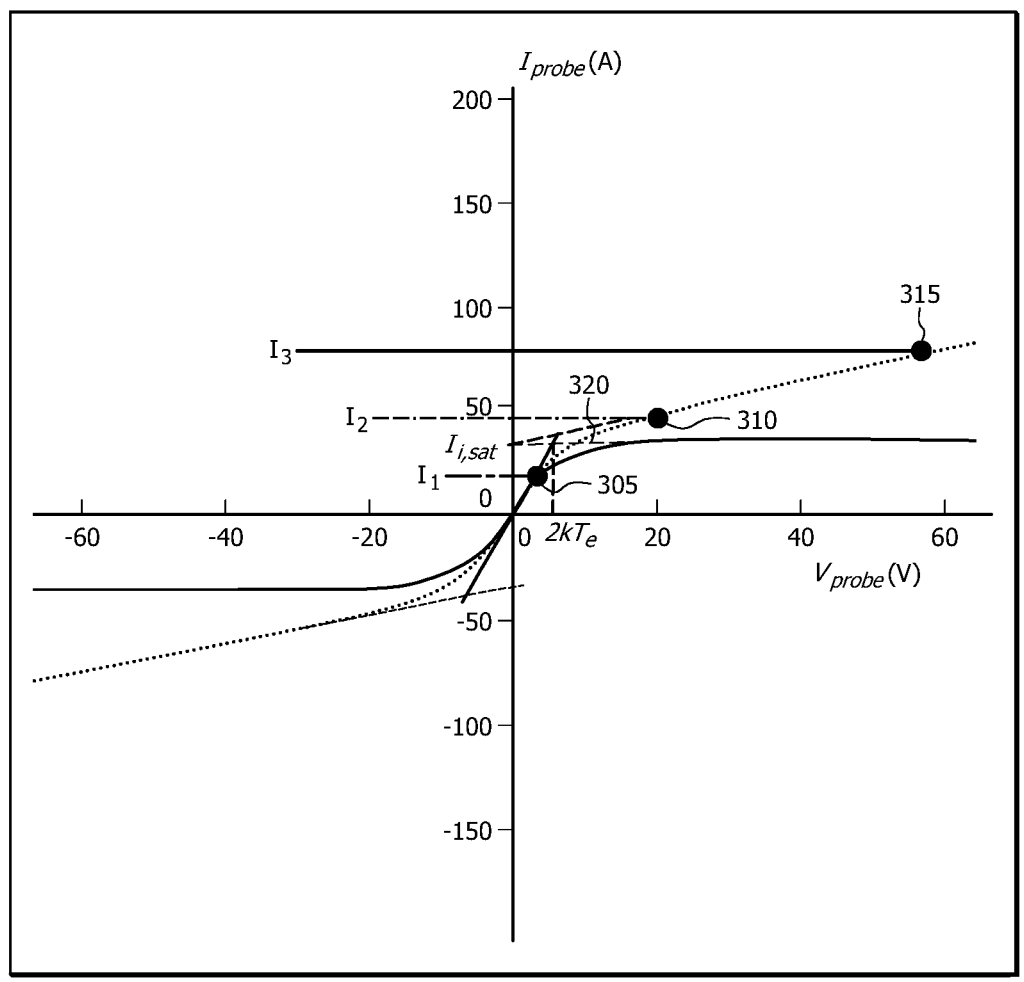
FIG. 3 illustrates an example graph of the currents produced by the Langmuir probe in FIG. 1, according to certain embodiments.

FIG. 3 illustrates an example graph 300 of the current produced by the Langmuir probe 100 shown in FIG. 1. As illustrated, the graph 300 may comprise of a first data point 305, a second data point 310, and a third data point 315. In embodiments, each of the first data point 305, second data point 310, and third data point 315 may be associated with one of the plurality of double Langmuir probes 125a, 125b (referring to FIG. 1) of the Langmuir probe 100 (referring to FIG. 1). Each of the first data point 305, second data point 310, and third data point 315 may correspond to a fixed voltage value (for example, voltages provided by the power source 150) and a related current value determined by the data acquisition system 105 (referring to FIG. 1). In one or more embodiments, the first data point 305, second data point 310, and third data point 315 may be transmitted to the information handling system 155 (referring to FIG. 1) for processing. By processing measurements from each of the plurality of double Langmuir probes 125a, 125b at fixed voltages, the information handling system 155 may be operable to process the measurements at a larger time resolution than typical processing of single or double Langmuir probes operating with voltage sweeping (i.e., at a faster rate). In embodiments, the information handling system 155 may be operable to fit a skewed hyperbolic tangent function to the first data point 305, second data point 310, and third data point 315. The information handling system 155 may accommodate the ion sheath expansion that occurs when measuring the plasma 110 (referring to FIG. 1) by subtracting the slope between the second data point 310 and the third data point 315 from the skewed hyperbolic tangent function, wherein this slope is an approximation. In response, the graph 300 may comprise a horizontal asymptote 320 for the skewed hyperbolic tangent function, wherein the ion saturation current ($I_{i,Sat}$) is equivalent to the value of the horizontal asymptote 320. After subtracting the ion sheath expansion from the skewed hyperbolic tangent function, the graph 300 may be characterized by Equation 1, shown below.

$$I = I_{i,Sat} \tanh\left(\frac{q_e V_{bias}}{2k_b T_e}\right) \tag{1}$$

Within Equation 1, $I_{i,Sat}$ may be defined as the ion saturation current at one of the plurality of double Langmuir probes 125a, 125b; $q_e$ may be defined as the electron charge (for example, 1.602E-19 C); $V_{bias}$ may be defined as the bias voltage applied between a set of one of the plurality of double Langmuir probes 125a, 125b (for example, the fixed voltage supplied by the power source 150); $k_b$ may be defined as the Boltzmann's constant (for example, 1.3806E-23 J/K or 1.602E-19 J/eV); and $T_e$ may be defined as the electron temperature. The information handling system 155 may be operable to determine the electron temperature of the plasma 110 from Equation 1. To determine the electron temperature of the plasma 110, Equation 2 shows the derivative of Equation 1 where the value of $V_{bias}$ is zero. Then, Equation 3 shows Equation 2 rewritten to solve for the electron temperature, $T_e$.

$$\frac{dI}{dV_{bias}} \Big|_{V_{bias}=0} = \frac{I_{i,Sat}}{2T_e} \tag{2}$$

$$T_e = \frac{I_{i,sat}}{2 dI/dV_{bias}} \tag{3}$$

The information handling system 155 may further be operable to determine the electron density of the plasma 110 from Equation 4, shown below. To determine the electron density of the plasma 110, Equation 4 equates the ion saturation current to the Bohm velocity related to the electron density and the area of a singular one of the plurality of double Langmuir probes 125a, 125b.

$$I_{i,Sat} = \alpha A_{probe} n v_{bohm} \tag{4}$$

Within Equation 4, $\alpha$ may be defined as a reference constant (for example, the value is approximately 0.5); $A_{probe}$ may be defined as the area of a singular one of the plurality of double Langmuir probes 125a, 125b that is inserted into the plasma 110; n may be defined as the electron density of the plasma 110; and $v_{bohm}$ may be defined as the Bohm velocity, shown below in Equation 5. To determine the electron density of the plasma 110, Equation 4 may be rewritten to solve for the electron density, n, as shown in Equation 6.

$$v_{bohm} = \sqrt{\frac{k_b T_e}{m_i}} \tag{5}$$

$$n = \frac{I_{i,Sat}}{\alpha A_{probe} v_{bohm}} \tag{6}$$

In one or more embodiments, the fixed voltage provided by the power source 150 for the first data point 305 may be selected to be less than the anticipated electron temperature of the plasma 110 to be measured. The second data point 310 and the third data point 315 may be selected to be greater than the anticipated electron temperature of the plasma 110 to be measured. These determinations may provide for a range that would encompass the anticipated electron temperature within the function fit to the first data point 305, second data point 310, and the third data point 315. For example, the first data point 305 may comprise a voltage value of 1 V, the second data point 310 may comprise a voltage value of 50 V, and the third data point 315 may comprise a voltage value of 60 V, wherein the value of the anticipated electron temperature may be between 1 V and 50 V.

Information handling system 155 may be any processing device that controls the operations of and/or produces data from the Langmuir probe 100 and the data acquisition system 105. Information handling system 155 may be hard-wired and/or wirelessly connected to the data acquisition system 105. Information handling system 155 may use one or more elements illustrated in FIG. 4.

Figure 4:
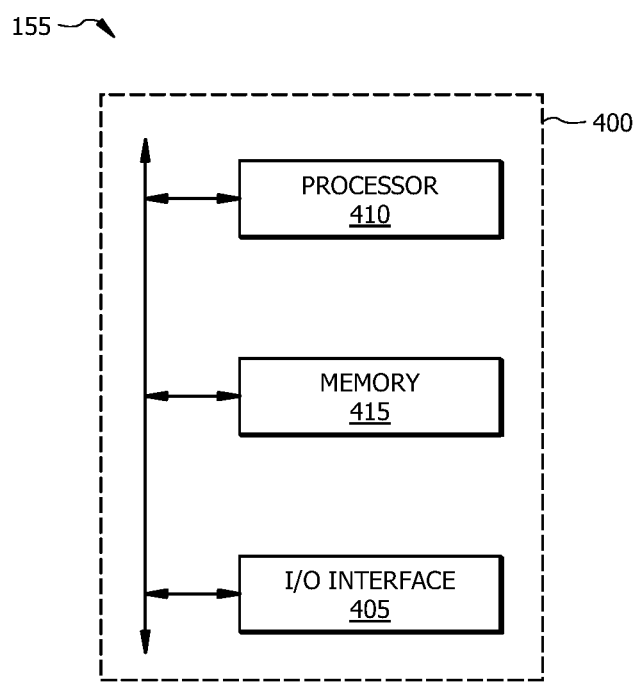
FIG. 4 illustrates an example information handling system to process the electrical circuit in FIG. 2, according to certain embodiments.

FIG. 4 illustrates an example of elements 400 that may be included in information handling system 155, according to embodiments. For example, information handling system 155 may include one or more input/output (I/O) interface(s) 405, processing circuitry such as a processor 410, memory (ies) 415, and/or other suitable element(s). Interface 405 receives input, sends output, processes the input and/or output, and/or performs other suitable operation. Interface 405 may comprise hardware and/or software.

Processing circuitry performs or manages the operations of the component. Processing circuitry may include hardware and/or software. Examples of a processing circuitry include one or more computers, one or more microprocessors, one or more applications, etc. In certain embodiments, processing circuitry executes logic (e.g., instructions) to perform actions (e.g., operations), such as generating output from input. The logic executed by processing circuitry may be encoded in one or more tangible, non-transitory computer readable media (such as memory 415). For example, the logic may comprise a computer program, software, computer executable instructions, and/or instructions capable of being executed by a computer. In particular embodiments, the operations of the embodiments may be performed by one or more computer readable media storing, embodied with, and/or encoded with a computer program and/or having a stored and/or an encoded computer program.

Memory 415 (or memory unit) stores information. Memory 415 may comprise one or more non-transitory, tangible, computer-readable, and/or computer-executable storage media. Examples of memory 415 include computer memory (for example, RAM or ROM), mass storage media (for example, a hard disk), removable storage media (for example, a Compact Disk (CD) or a Digital Video Disk (DVD)), database and/or network storage (for example, a server), and/or other computer-readable medium.

Herein, a computer-readable non-transitory storage medium or media may include one or more semiconductor-based or other integrated circuits (ICs) (such field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

With reference to FIGS. 1-4, the method as presented in the present disclosure may be described. An operator may utilize the Langmuir probe 100 to measure a parameter of the plasma 110 (for example, density and/or temperature). Specifically, the Langmuir probe 100 may be at least partially inserted into the plasma 110 and actuated to apply a current based on a fixed voltage through each of the plurality of double Langmuir probes 125a, 125b. The electrical circuits 200 for each of the plurality of double Langmuir probes 125a, 125b may float freely to arbitrary floating potentials without reference to a grounding. The current produced by the voltages from each of the plurality of double Langmuir probes 125a, 125b may be processed by the data acquisition system 105 coupled to the Langmuir probe 100. The data acquisition system 105 may determine the current-voltage relationship as the Langmuir probe 100 measures the plasma 110. The information handling system 155 may receive data for the determined current-voltage relationship, such as the first data point 305, second data point 310, and third data point 315. The information handling system 155 may be operable to determine the electron temperature of the plasma 110 and/or the electron density of the plasma 110 based, at least in part, on the first data point 305, second data point 310, and third data point 315. The information handling system 155 may further accommodate the ion sheath expansion that occurs when conducting such measurements.

The present disclosure may provide numerous advantages, such as the various technical advantages that have been described with respective to various embodiments and examples disclosed herein. Other technical advantages will be readily apparent to one skilled in the art from the following figures, descriptions, and claims. Moreover, while specific advantages have been enumerated in this disclosure, various embodiments may include all, some, or none of the enumerated advantages.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Although this disclosure describes or illustrates particular embodiments as providing particular advantages, particular embodiments may provide none, some, or all of these advantages.

What is claimed is:

1. A Langmuir probe, comprising:
   a housing comprising an outer diameter and an inner diameter, wherein the inner diameter defines an inner cavity;
   a plurality of cylindrical bodies disposed at least partially within the inner cavity, the plurality of cylindrical bodies being positioned in a parallel formation so as to abut each other within a grouping, wherein each of the plurality of cylindrical bodies comprises a set of internal cylindrical cavities; and
   a plurality of double cylindrical Langmuir probes disposed within each pair of the set of internal cylindrical cavities.

2. The Langmuir probe of claim 1, wherein each of the plurality of double cylindrical Langmuir probes extends past a top end of each of the plurality of cylindrical bodies.

3. The Langmuir probe of claim 1, wherein the housing and the plurality of cylindrical bodies comprise aluminum.

4. The Langmuir probe of claim 3, wherein the plurality of double cylindrical Langmuir probes comprises tungsten.

5. The Langmuir probe of claim 1, wherein there are three of the plurality of cylindrical bodies and three sets of the double cylindrical Langmuir probes.

6. A system for measuring a plasma, comprising:
   a Langmuir probe, comprising:
      a housing comprising an outer diameter and an inner diameter, wherein the inner diameter defines an inner cavity;
      a plurality of cylindrical bodies disposed at least partially within the inner cavity, the plurality of cylindrical bodies being positioned in a parallel formation so as to abut each other within a grouping, wherein each of the plurality of cylindrical bodies comprises a set of internal cylindrical cavities; and
      a plurality of double cylindrical Langmuir probes disposed within each pair of the set of internal cylindrical cavities;
   a data acquisition system coupled to the Langmuir probe; and
   an information handling system communicatively coupled to the data acquisition system.

7. The system of claim 6, wherein the data acquisition system comprises a power source operable to provide power to each of the plurality of double cylindrical Langmuir probes, and wherein the power source is operable to provide a fixed voltage less than an electron temperature of the plasma to one of the plurality of double cylindrical Langmuir probes.

8. The system of claim 6, wherein the data acquisition system comprises a power source operable to provide power to each of the plurality of double cylindrical Langmuir probes, and wherein the power source is operable to provide a fixed voltage greater than an electron temperature of the plasma to at least two of the plurality of double cylindrical Langmuir probes.

9. The system of claim 6, wherein there are three of the plurality of cylindrical bodies, all having a first diameter, and three pairs of the double cylindrical Langmuir probes, each probe disposed within a corresponding internal cylindrical cavity having a second diameter, and wherein a sum of second diameters of each pair of the set of internal cylindrical cavities is less than the first diameter.

10. The system of claim 6, wherein each of the plurality of double cylindrical Langmuir probes extends past a top end of each of the plurality of cylindrical bodies.

11. The system of claim 6, wherein the information handling system is operable to determine an electron temperature of the plasma and an electron density of the plasma based, at least in part, on current measurements applied to the plasma with the Langmuir probe.

12. The system of claim 9, wherein each pair of the set of internal cylindrical cavities is aligned along a diameter of each of the three of the plurality of cylindrical bodies, and wherein lines connecting centers of the set of internal cylindrical cavities form a hexagonal.

13. The system of claim 10, wherein each of the plurality of cylindrical bodies extend past a top end of the inner cavity.

14. The system of claim 12, wherein:
- a first pair of the set of internal cylindrical cavities within a first cylindrical body from the three of the plurality of cylindrical bodies is aligned along a direction parallel to a line connecting centers of a second and a third cylindrical body from the three of the plurality of cylindrical bodies;
- a second pair of the set of internal cylindrical cavities within the second cylindrical body is aligned along a direction parallel to a line connecting centers of the first and the third cylindrical body; and
- a third pair of the set of internal cylindrical cavities within the third cylindrical body is aligned along a direction parallel to a line connecting centers of the first and the second cylindrical body.

* * * * *